United States Patent [19]

Satoh et al.

[11] Patent Number: 4,472,622
[45] Date of Patent: Sep. 18, 1984

[54] APPARATUS FOR THERMAL TREATMENT OF SEMICONDUCTORS

[75] Inventors: Ryozo Satoh, Yamato; Takeshi Inoue, Yokohama; Seishiro Sato, Machida, all of Japan

[73] Assignee: Tel-Thermco Engineering Co., Ltd., Yokohama, Japan

[21] Appl. No.: 132,729

[22] Filed: Mar. 24, 1980

[30] Foreign Application Priority Data

Apr. 18, 1979 [JP] Japan .................................. 54-47476

[51] Int. Cl.$^3$ ........................... B01J 3/04; F01B 5/16; C23C 11/00
[52] U.S. Cl. .................................... 219/390; 422/113; 432/205
[58] Field of Search ................ 118/50, 50.1, 641, 640; 432/253, 258, 205; 13/20; 219/390; 422/199, 208, 241; 148/189

[56] References Cited

U.S. PATENT DOCUMENTS

| | | | |
|---|---|---|---|
| 3,096,822 | 6/1978 | Yamawaki et al. | 118/48 |
| 3,517,643 | 6/1970 | Goldstein | 118/48 |
| 3,526,205 | 9/1970 | Rosenheinrich | 118/49 |
| 3,554,162 | 1/1971 | Cota et al. | 118/48 |
| 3,578,495 | 5/1971 | Pammer et al. | 117/201 |
| 3,666,546 | 5/1972 | Reuter et al. | 117/201 |
| 3,698,354 | 10/1972 | Reuschel et al. | 118/49.1 |
| 3,701,682 | 10/1972 | Gartman et al. | 117/201 |
| 3,750,620 | 7/1973 | Eversteijn et al. | 118/48 |
| 4,129,090 | 12/1978 | Inawiwa et al. | 118/49 |
| 4,235,841 | 11/1980 | Zimmerman | 422/199 |
| 4,805,735 | 3/1974 | Reuschel et al. | 118/48 |

*Primary Examiner*—Bernard Roskoski
*Attorney, Agent, or Firm*—Robert J. Fox; Neil M. Rose; Clifford A. Dean

[57] ABSTRACT

In an apparatus for thermal treatment of semiconductors in a treating gas, a treating tube has a heating portion, an extending portion, and a sealing portion, and convection-preventing plates are disposed within a treating tube, between one end of the heating portion and the sealing portion, so as to interrupt currents of the treating gas. A heating element is arranged so that the quantities of heat generated along the heating portion are largest near a gas-discharging end of the heating portion, intermediate near a gas-discharging end thereof, and smallest therebetween. The plates are mounted to the sealing portion so as to be inserted into the treating tube when the sealing portion is attached and so as to be withdrawn from the treating tube when the sealing portion is detached. The plates may be mounted integrally to the sealing portion.

3 Claims, 10 Drawing Figures

T: Tc Tb Ta
W: Wc Wb Wa

APPARATUS FOR THERMAL TREATMENT OF SEMICONDUCTORS

BACKGROUND OF THE INVENTION

The present invention relates to improved apparatus for thermal treatment of semiconductors in a treating gas.

As a consequence of recent trends, there has been a gradual tendency for semiconductors to be processed as wafers of larger dimensions, whereupon wafers as large as 5 inches, 127 mm, in diameter may be encountered in some instances. Hence, it has become necessary for semiconductor treating tubes to be increased in size to outer diameters of 150 to 160 mm. Wafer-carrying boats also have been increased in size to lengths as long as 800 mm.

In semiconductor treating tubes, it is known for baffle plates to be used to prevent intrusion of an external gas, to utilize an internal gas effectively, and to distribute an internal gas uniformly, but a sealing cap ordinarily is attached to a treating tube so as to prevent escape of an internal gas, and so as to prevent intrusion of an external gas.

In thermal treatment of a wafer in a treating tube having a heating portion, which is heated to high internal temperatures by a heating element surrounding the heating portion, a boat carrying the wafer may have to be inserted through a region having a steep gradient of temperature within the heating portion of the treating tube. Alternatively, the boat carrying the wafer may have to be withdrawn through a region having such a gradient. In either instance, cracks or pinholes may be formed in the wafer by thermal stress, and there may be other problems, such as a short circuit or thermal breakage of the treating tube at its end portions exposed to the outside atmosphere.

From prior efforts to eliminate these problems, it is known for an extending portion of the treating tube to protrude longitudinally from a heat-insulating member, which surrounds the heating portion of the treating tube, in a direction of discharge of a treating gas flowing from an inlet of the treating tube to an outlet of the treating tube, so as to smoothen the temperature gradient, and so as to enable a wafer to be preheated, cooled, or both in the extending portion of the treating tube.

It is known for a useful region within a treating tube, which is heated along a heating portion as noted above, to exhibit a uniform temperature for a given dimension measured longitudinally along the treating tube. The longitudinal dimension of the useful region exhibiting a uniform temperature limits the semiconductor-treating capacity of the treating tube. However, if the treating tube has been provided with an extending portion as noted above, there heretofore has been an abrupt reduction in the longitudinal dimension of the useful region exhibiting a uniform temperature, whereupon the extending portion of the treating tube heretofore has had a characteristic disadvantage, as there has been a similar reduction in the semiconductor-treating capacity of the treating tube.

For reasons explained below, eliminating the aforementioned disadvantage by changing the quantities of heat generated at the opposite ends of the heating portion of the treating tube is not possible.

Ordinarily, temperature reductions within the treating tube are larger at opposite end parts of the heating portion of the treating tube than at a central part of the heating portion of the treating tube, since heat losses are extreme at the opposite ends of the heating portion of the treating tube. Accordingly, it is known for the quantities of heat generated (i.e. electric power) to be increased at opposite end parts of the heating portion of the treating tube. Since heat losses are greater at the treating gas outlet end where the treating tube has an extending portion, it is known for the quantity of heat generated at the treating gas outlet end to be increased above the quantity of heat generated at the treating gas inlet end. However, it has been found that, even at a uniform temperature of 1000° C., a local region of lower temperature (dip) appears in the temperature gradient, near the treating gas outlet end.

Accordingly, the longitudinal dimension of the useful region exhibiting a uniform temperature is shortened, because the local region of lower temperature is excluded.

SUMMARY OF THE INVENTION

The present invention may be embodied in an apparatus for thermal treatment of semiconductors in a treating gas.

The apparatus comprises a treating tube, which is adapted to hold semiconductors, which has a heating portion having a gas-admitting end and a gas-discharging end, an extending portion extending from the gas-discharging end of the heating portion and being integral to the heating portion, and a sealing portion being attachable to and detachable from the extending portion, and which has an inlet for admission of the treating gas into the gas-admitting end of the heating portion and an outlet for discharge of the treating gas from the extending portion. The sealing portion seals the treating tube except for the inlet and the outlet when the sealing portion is attached to the extending portion.

The apparatus also comprises a heating element, which is mounted around the heating portion of the treating tube between the gas-admitting end and the gas-discharging end, and which is arranged to generate controlled quantities of heat per unit length along the heating portion of the treating tube.

As improved by the present invention, a plurality of convection-preventing plates are mounted to the sealing portion of the treating tube so as to be inserted into the treating tube when the sealing portion is attached and so as to be withdrawn from the treating tube when the sealing portion is detached. Preferably, the plates are mounted integrally to the sealing portion.

Preferably, each plate has a substantially disc-like shape and is disposed transversely with respect to the treating tube. Alternatively, the sealing portion may have a substantially frusto-conical shape, a substantially cap-like shape, or a substantially disc-like shape.

These and other objects, features, and advantages of the present invention will be evident from the following description of preferred embodiments of this invention.

DETAILED DESCRIPTION OF PREFERRED EMBODIMENT

In accordance with the present invention, there is provided an apparatus for thermal treatment of semiconductors, which are processed as wafers, in a treating gas, which may be a mixture of gases.

Figure 1:
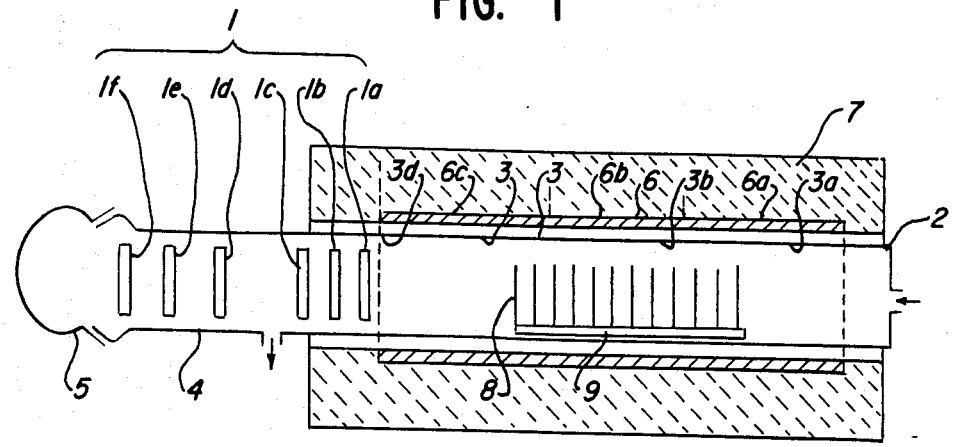
FIG. 1 is a longitudinal, sectional view illustrating a general arrangement of components of an apparatus embodying the present invention and including convection-preventing plates disposed in a treating tube.

As shown in FIG. 1, the apparatus comprises a treating tube 2, which has a heating portion 3 having a gas-admitting end and a gas-discharging end 3d, an extending portion 4 extending from the gas-discharging end of the heating portion 3 and being integral to the heating portion 3, and a sealing portion 5 being attachable to and detachable from the extending portion 4. The treating tube 2 has an inlet, in an end wall of the treating tube 2, for admission of the treating gas into the gas-admitting end of the heating portion 3 and an outlet, in a side wall of the treating tube 2, for discharge of the treating gas from the gas-discharging end of the heating portion 3. The sealing portion 5 seals the treating tube 2, except for the inlet and the outlet, when the sealing portion 5 is attached to the extending portion 4.

The treating tube 2 may be made of quartz, silicon carbide, or other refractory material of high purity and mechanical strength, and of chemical compatibility.

The heating element 6 is arranged so that the quantities of heat generated per unit length of the treating tube 2 are largest along the subportion 3c of the heating portion 3, as generated by the subportion 6c of the heating element 6, intermediate along the subportion 3a of the heating portion 3, as generated by the subportion 6a of the heating element 6, and smallest along the subportion 3b of the heating portion 3, as generated by the subportion 6b of the heating element 6.

As shown in FIG. 1, a boat 9 carrying a plurality of wafers 8 is disposed within the heating portion 3 of the treating tube 2. The boat 9 carrying the wafers 8 may be inserted into and withdrawn from the treating tube 2 when the sealing portion 5 is detached.

Figure 2:
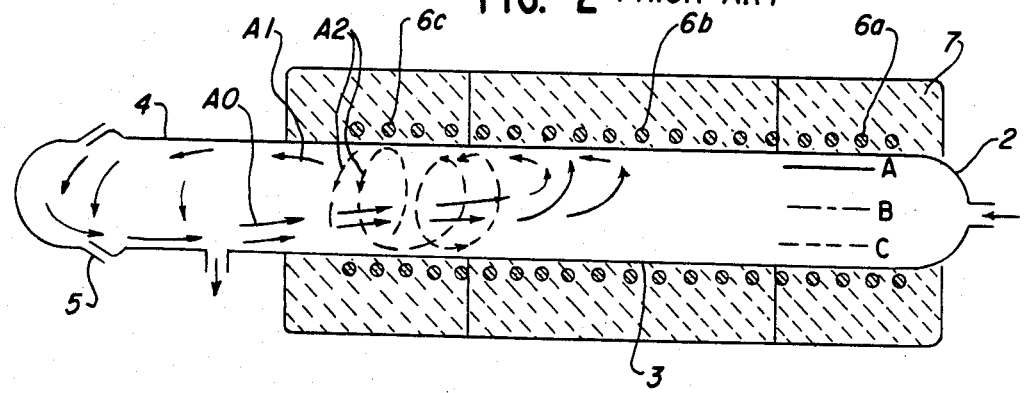
FIG. 2 is a longitudinal, sectional view illustrating conventional apparatus (without convection-preventing plates) and indicating convection currents in such apparatus. Primed reference numbers in FIG. 2 and unprimed reference numbers in FIG. 1 refer to components of similar structure and similar purpose.

The heating portion 3 of the treating tube 2 is divided into three subportions, a subportion 3a extending to the gas-admitting end, a subportion 3b, and a subportion 3c extending to the gas-discharging end 3d. The subportion 3b extends between the subportion 3a and the subportion 3c. The heating element 6 may comprise either a heat-conducting sleeve, as shown in FIGS. 1 and 4 through 6, or an array of helical heating coils, as shown in FIG. 2. The heating element 6 is divided into three subportions, a subportion 6a surrounding the subportion 3a of the heating portion 3, a subportion 6b surrounding the subportion 3b of the heating portion 3, and a subportion 6c surrounding the subportion 3c of the heating portion 3. The heating element 6 is covered by a heat-insulating member 7, which may be divided in like manner, as shown in FIG. 2.

A plurality of convection-preventing plates 1, each of which has a substantially disc-like shape and is disposed transversely with respect to the treating tube 2, are disposed within the treating tube 2, between a position near the gas-discharging end 3d of the heating portion 3 and a position near the sealing portion 5, so as to interrupt currents of the treating gas. A space is provided between adjacent ones of the plates 1. The plates 1 may be made of the refractory material of the treating tube 2.

In one method of preparation of the apparatus, the sealing portion 5 and the respective plates 1 are removed from the treating tube 2, which has been heated, and the boat 9 carrying the wafers 8 is inserted into the treating tube 2 and set at a predetermined location within the treating tube 2. The predetermined location of the boat 9 carrying the wafers 8 places the wafers 8 within the useful region exhibiting a uniform temperature in operation of the apparatus. Thereupon, the respective plates 1 are replaced within the treating tube 2, and the sealing portion 5 is attached to the extending portion 4. The uniform temperature of the useful region, wherein the boat 9 carrying the wafers 8 thus is disposed, can be adjusted while the treating gas either is or is not introduced through the inlet of the treating tube 2.

Alternatively, the boat 9 carrying the wafers 8 may be inserted into the treating tube 2 and set at the predetermined location within the treating tube 2, at room temperature, whereupon the respective plates 1 are replaced, the sealing portion 5 is attached to the extending portion 4, and the wafers 8 undergo thermal treatment while a treating gas is introduced in accordance with a programmed temperature-time cycle.

Figure 4:
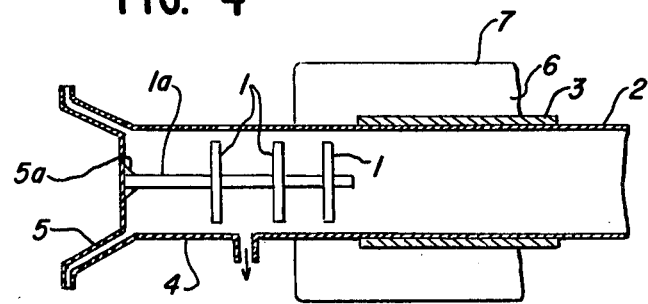
FIGS. 4 through 6 are fragmentary, longitudinal, sectional views being comparable to FIG. 1, and to each other, and illustrating alternative specific arrangements of components of an apparatus embodying the present invention.
Figure 5:
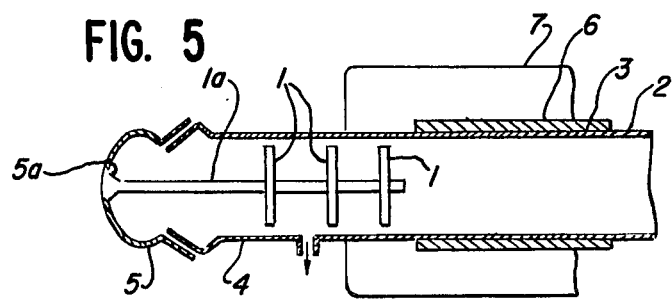
Figure 6:
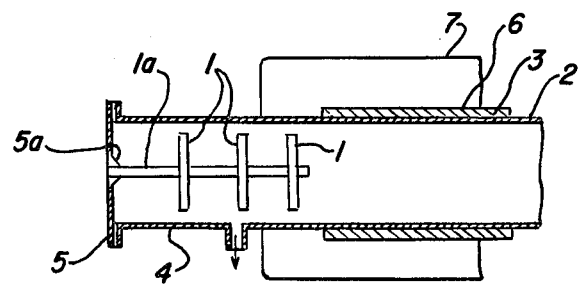

As shown in alternative embodiments in FIGS. 4 through 6, the sealing portion 5 of the treating tube 2 may take any of several shapes, whereupon adjoining end parts of the extending portion 4 of the treating tube 2 must be complementarily shaped, so as to enable a hermetic seal to be effected when the sealing portion is attached to the extending portion 4.

As shown in FIG. 4, the sealing portion 5 may have a substantially frusto-conical shape, whereupon the sealing portion 5 is fitted into adjoining end parts of the extending portion 4 when the sealing portion 5 is attached. As shown in FIG. 5, the sealing portion 5 may have a substantially cap-like shape, whereupon the sealing portion 5 is fitted onto adjoining end parts of the extending portion 4 when the sealing portion 5 is attached. As shown in FIG. 6, the sealing portion 5 may have a substantially disc-like shape, whereupon the sealing portion 5 is fitted against adjoining end parts of the extending portion 4 when the sealing portion 5 is attached.

As shown in each embodiment in FIGS. 4 through 6, the plurality of convection-preventing plates 1 are mounted to the sealing portion 5 so as to be inserted into the treating tube 2 when the sealing portion 5 is attached and so as to be withdrawn from the treating tube 2 when the sealing portion 5 is detached, by means of a supporting rod 1a mounting the plates 1 integrally to the sealing portion 5. Although each embodiment in FIGS. 4 through 6 is shown to have three plates 1, more plates can be mounted in like manner. The supporting rod 1a passes through central openings in the plates 1, which are disposed in spaced positions along the supporting rod 1a and are fixed to the supporting rod 1a, and fixed into an integral portion 5a of the sealing portion 5 so as to extend longitudinally into the treating tube 2 when the sealing portion 5 is attached. Sufficient clearance is provided between the plates 1 and the treating tube 2 so as to facilitate insertion of the plates 1 and so as to allow discharge of the treating gas through the outlet, as indicated by arrows in FIGS. 4 through 6.

Figure 10:
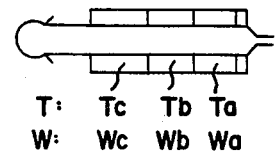
FIG. 10 is a diagramatic, sectional view showing locations of measurements of temperature and power for purposes of FIGS. 7 through 9.

Comparative data are presented below for the apparatus of FIG. 1 wherein five convection-preventing plates (1a, 1b, 1c, 1d, and 1e) are provided, similar apparatus wherein three convection-preventing plates (1a, 1b, and 1c) are provided, and conventional apparatus of FIG. 6 wherein no convection-preventing plates are provided. In each instance, a quartz tube having an outer diameter of 160 mm (and a wall thickness of about 3 mm) is used as the treating tube 2. With reference to FIG. 10, it is to be understood that the temperatures of the outer surfaces of the subportions 3a, 3b, and 3c of the heating portion 3 of the treating tube 2 are Ta, Tb, and Tc, respectively, and that the corresponding electric powers dissipated by the subsections 6a, 6b, and 6c of the heating element 6 are adjusted to Wa, Wb, and Wc, respectively.

Figure 7:
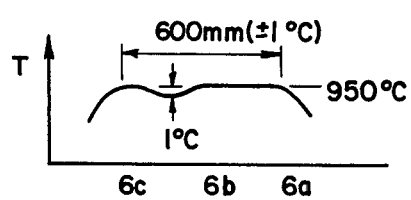
FIG. 7 is a temperature diagram showing characteristics of temperature as a function of position in a preferred embodiment of the present invention according to claim 1.

If five convection-preventing plates (1a, 1b, 1c, 1d, and 1e) are arranged over a range of about 300 mm, a temperature curve as shown in FIG. 7 is obtained, and a useful region of uniform heating temperature of a length of about 600 mm with a temperature fluctuation of ±1° C. is obtained. Data relating to Ta, Tb, and Tc, and data relating to the corresponding electric power consumptions Wa, Wb, and Wc, are shown in Table 1 below.

TABLE 1

| Tc | Tb | Ta |
|---|---|---|
| 995° C. | 950° C. | 980° C. |
| Wc | Wb | Wa |
| 55 | 18 | 30 |

Figure 8:
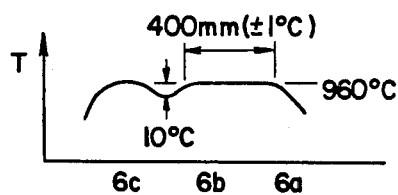
FIG. 8 is a comparable diagram showing characteristics of temperature as a function of position in a modified embodiment.

If three convection-preventing plates (1a, 1b, and 1c) are arranged over a range of about 100 mm near the gas-discharging end 3d of the heating portion 3, a temperature curve as shown in FIG. 8 is obtained, a local region of lower temperature (lower by about 10° C.) is formed, and a useful region of uniform heating temperature of about 400 mm with a temperature fluctuation of ±1° C. is obtained. Data relating to the temperatures Ta, Tb, and Tc, and data relating to the corresponding electric power consumptions Wa, Wb, and Wc, are shown in Table 2 below.

TABLE 2

| Tc | Tb | Ta |
|---|---|---|
| 1030° C. | 950° C. | 980° C. |
| Wc | Wb | Wa |
| 65 | 15 | 30 |

Figure 9:
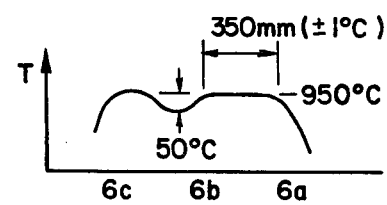
FIG. 9 is a comparable diagram showing characteristics of temperature as a function of position in conventional apparatus according to FIG. 2.

In an apparatus of similar construction except that no convection-preventing plates are provided, a temperature curve as shown in FIG. 9 is obtained, a local region of lower temperature (lower by about 50° C.) is formed and the useful region of uniform heating temperature with a temperature fluctuation of ±1° C. is reduced to a length of 350 mm. Data relating to the temperatures Ta, Tb, and Tc, and data relating to the corresponding electric power consumptions Wa, Wb, and Wc, are shown in Table 3 below.

TABLE 3

| Tc | Tb | Ta |
|---|---|---|
| 1150° C. | 950° C. | 980° C. |
| Wc | Wb | Wa |
| 90 | 10 | 30 |

In Tables 1 through 3 above, data relating to Wa, Wb, and Wc are shown in comparative units of power consumption.

The convection phenomenon in the treating tube of conventional apparatus, in which no convection-preventing plates are provided, is described below with reference to FIG. 2.

In the treating tube 2', large convection currents indicated by arrows $A_0$ and $A_1$ appear, and the treating gas is cooled in the extending portion 4' and the sealing portion 5', circulated in a lower portion of the treating tube as indicated by arrow $A_0$, and guided to the central part of the heating portion 3'. Then, the treating gas is passed through an upper portion of the treating tube 2' and returned to the original point. The treating gas circulates repeatedly along this course. Furthermore, small convection currents, which recirculate in a short range as indicated by arrow $A_2$, are formed.

Figure 3:
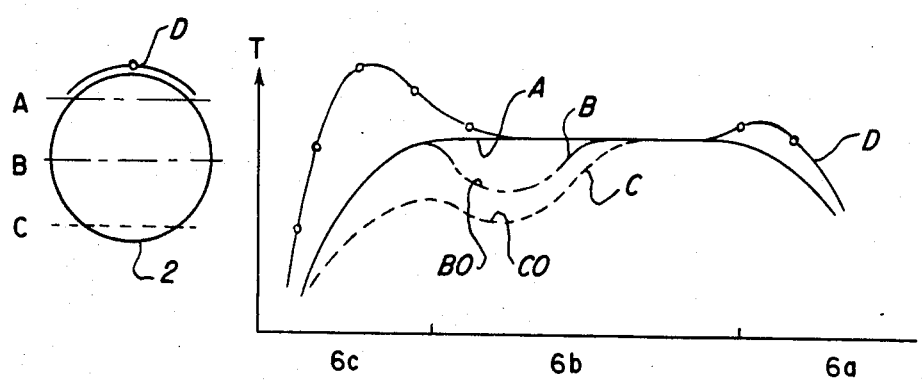
FIG. 3 is a temperature diagram showing characteristics of temperature as a function of position, at different cross-sectional levels in conventional apparatus, according to FIG. 2, wherein some of the cross-sectional levels also are indicated.

Moreover, as shown in FIG. 3, the temperature T in the upper portion within the treating tube 2', is uniform along a central part of the treating tube 2', as indicated by temperature curve $A_1$. However, local regions Bo and Co of lower temperature appear as formed by the convection currents noted above, as indicated by temperature curves B and C. The temperatures outside the treating tube 2' are highest at the treating gas discharging end, moderate at the treating gas admitting end, and lowest in the central part, as indicated by temperature curve D. Temperature curves A, B, C, and D correspond to positions A, B, C, and D shown in FIG. 2 and FIG. 3.

Accordingly, if a plurality of convection-preventing plates are provided as disclosed herein, a local region of lower temperature (dip) can be substantially eliminated, and the longitudinal dimension of the useful region of uniform heating temperature can be substantially increased so as to enhance the semiconductor-treating capacity of the apparatus, without provision of additional heating elements and without increase in electric power consumption.

We claim:

1. In an apparatus for thermal treatment of semiconductors in a treating gas, of a type comprising
   (a) a treating tube, which is adapted to hold semiconductors, which has a heating portion having a gas-admitting end and a gas-discharging end and being adapted to hold semiconductors for thermal treatment in the treating gas, an extending portion extending from the gas-discharging end of the heating portion and being integral to the heating portion, and a sealing portion being attachable to and detachable from the extending portion, and which has an inlet for admission of the treating gas into the gas-admitting end of the heating portion and an outlet for discharge of the treating gas from the extending portion, wherein the sealing portion seals the treating tube except for the inlet and the outlet when the sealing portion is attached to the extending portion, and wherein the sealing portion must be detached from the extending portion for insertion of semiconductors into the heating portion through the extending portion and for withdrawal of semiconductors from the heating portion through the extending portion, (b) a heating element, which is mounted around the heating portion of the treating tube between the gas-admitting end and the gas-discharging end, and which is arranged to generate controlled quantities of heat per unit length along the heating portion of the treating tube, and (c) a plurality of convection-preventing plates, which are disposed within the treating tube in respective positions near the outlet, between semiconductors when held in the heating portion and the sealing portion when attached to the extending portion, so as to interrupt currents of the treating gas within the treating tube near the outlet when the sealing portion is attached, wherein clearance is provided between the plates and the treating tube so as to allow discharge of the treating gas through the outlet, and wherein the plates are removable from the tube for insertion of semiconductors into the treating tube through the extending portion and for withdrawal of semiconductors from the heating portion through the extending portion, an improvement wherein the plates are mounted integrally to the sealing portion of the treating tube by a supporting rod fixed to the plates and to the sealing portion, so as to be inserted into the treating tube when the sealing portion is attached and so as to be withdrawn from the treating tube when the sealing portion is detached, wherein clearance provided between the plates and the treating tube so as to allow discharge of the treating gas through the outlet also facilitates insertion and withdrawal of the plates upon attachment and detachment of the sealing portion, whereby disposition of the plates within the treating tube in respective positions near the outlet, between semiconductors when held in the heating portion and the sealing portion when attached to the extending portion, so as to interrupt currents of the treating gas within the treating tube near the outlet is accomplished by attachment of the sealing portion to the extending portion.

2. The apparatus of claim 1 wherein the sealing portion has a substantially frusto-conical shape.

3. The apparatus of claim 1 wherein the sealing portion has a substantially cap-like shape.

* * * * *